United States Patent [19]

Hamburgen

[11] Patent Number: 5,235,211
[45] Date of Patent: Aug. 10, 1993

[54] SEMICONDUCTOR PACKAGE HAVING WRAPAROUND METALLIZATION

[75] Inventor: William R. Hamburgen, Menlo Park, Calif.

[73] Assignee: Digital Equipment Corporation, Maynard, Mass.

[21] Appl. No.: 542,179

[22] Filed: Jun. 22, 1990

[51] Int. Cl.[5] .................. H01L 23/02; H01L 23/12; H01L 23/48; H01L 29/40

[52] U.S. Cl. .................. 257/758; 257/698; 257/700; 257/706; 257/719; 257/774; 257/773; 257/784

[58] Field of Search .................. 357/74, 75, 68, 71, 357/81

[56] References Cited

U.S. PATENT DOCUMENTS 3,908,185  9/1975  Martin .................. 357/74
4,910,584  3/1990  Mizuo .................. 357/74
4,922,324  5/1990  Sudo .................. 357/75

*Primary Examiner*—Andrew J. James
*Assistant Examiner*—Carl Whitehead, Jr.
*Attorney, Agent, or Firm*—Flehr, Hohbach, Test, Albritton & Herbery

[57] ABSTRACT

Semiconductor package and method in which a cavity is provided for a chip or die, a bonding shelf extends peripherally of the cavity, and a layer of metallization extends along the under side of the shelf, wraps around the inner peripheral edge of the shelf and extends along the inner margin of the upper surface of the shelf to form a conductive ring to which a lead from the chip is bonded. Additional bonding pads are formed on the upper surface of the shelf, and additional leads from the chip are attached to these pads. In one embodiment, locating fingers align the chip precisely within the cavity.

20 Claims, 3 Drawing Sheets

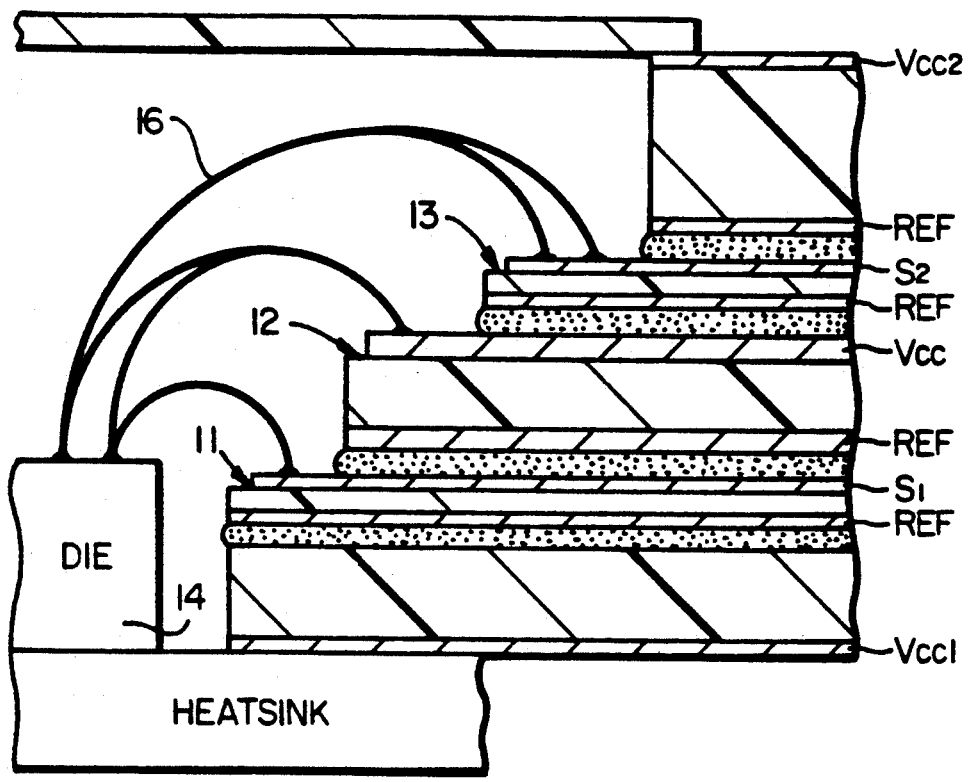
FIG_1
(PRIOR ART)
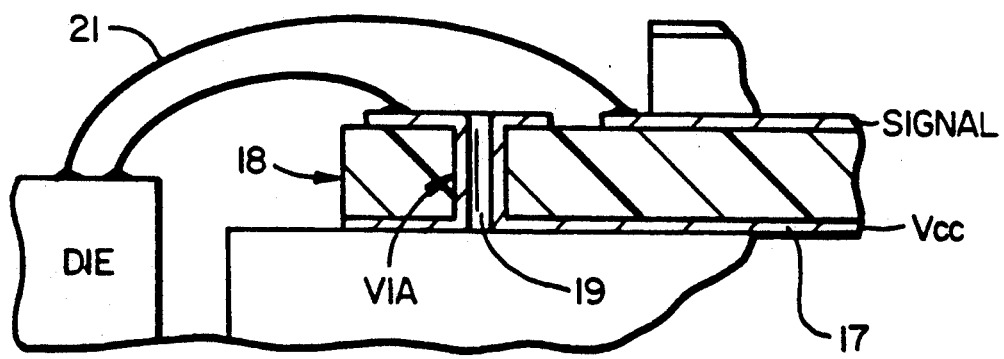
FIG_2
(PRIOR ART)

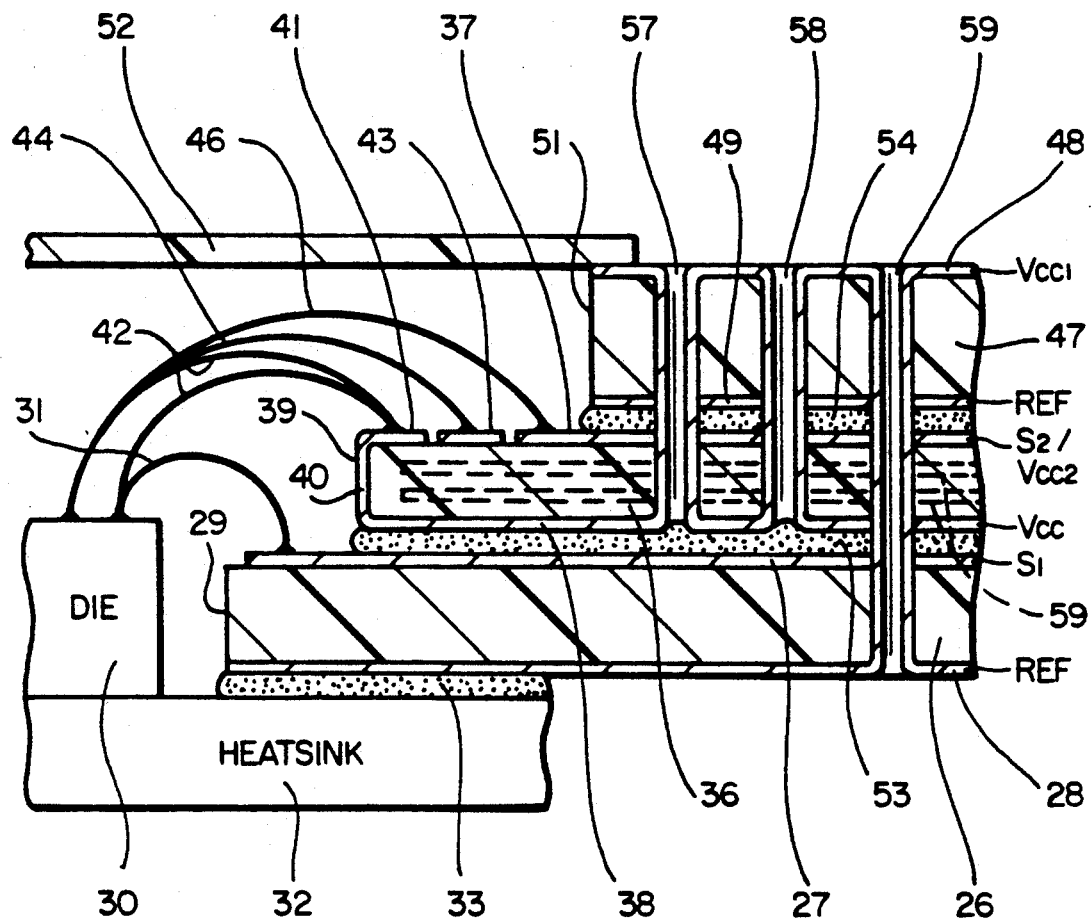
FIG_3

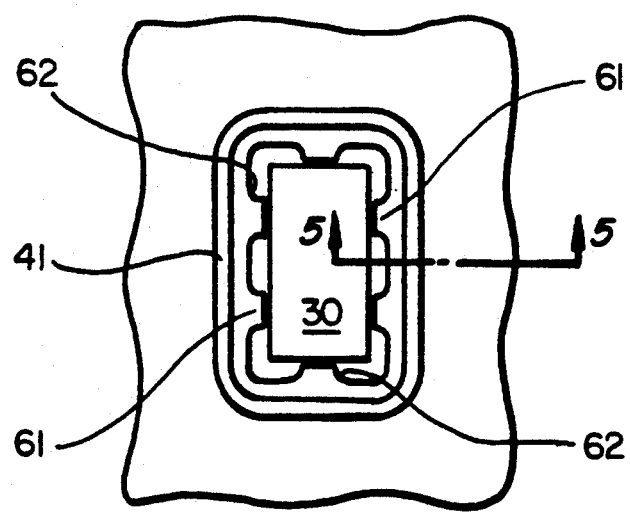
FIG_4
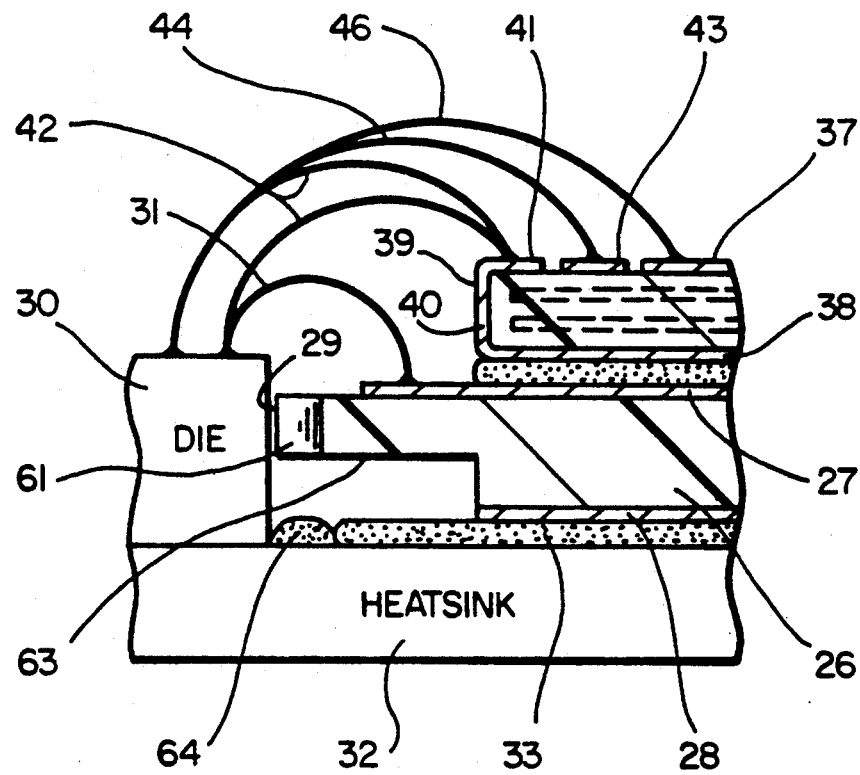
FIG_5

SEMICONDUCTOR PACKAGE HAVING WRAPAROUND METALLIZATION

This invention pertains generally to semiconductor devices and, more particularly, to the packaging of a semiconductor chip or die.

A common type of plastic pin grid array (PPGA) package heretofore provided is similar in construction to printed wiring boards, the main difference being that the package has a cavity in the middle, with a series of shelves carrying various package layers and traces for wire bonding to a chip. For a low inductance power or ground wirebond shelf, an entire layer on a bonding shelf generally has to be dedicated to that particular voltage. An example of a package of this type is illustrated in FIG. 1.

The package illustrated in FIG. 1 has a series of three bonding shelves or tiers designated by the reference numerals 11, 12 and 13 surrounding a die or chip 14. Each of these shelves has a layer of metallization on its upper surface to which a one or more leads 16 from the chip is attached. The metallization layer on the middle shelf 12 carries the supply voltage $V_{CC}$, and the entire shelf is dedicated to this particular voltage. There are no other bonding pads or leads on this shelf.

An alternative to dedicating an entire layer on a bonding shelf to a single ground or power supply voltage is to connect a continuous wirebonding pad for the ground or supply voltage to another layer of the package with an array of vias. However, this adds inductance to the power or ground path and causes the bonding leads on successive shelves to become substantially longer, adding inductance there as well. An example of this technique is illustrated in FIG. 2.

In the package illustrated in FIG. 2, the supply voltage $V_{CC}$ is carried by a metallization layer 17 on the under side of a bonding shelf 18, and connections to this layer are made through a series of vias 19 passing through the shelf. Leads 21 connected to other bonding pads on the shelf extend beyond the vias and have substantially more inductance than is generally desired.

In another package heretofore provided, connections with a metalliaation layer on the under side of a bonding shelf are made by one or more conductive fingers or traces which extend between the upper and lower sides of the shelf at the edge of the opening in which the die is mounted.

Another problem with semiconductor packages of the prior art is that the number of bonding pads or leads which can be employed is limited by physical parameters such as the width of the pads and the need to maintain a certain minimum spacing between them. This has led to the use of multiple rows of pads, with the pads in each adjacent rows being offset or staggered from each other. With staggered pads, however, the bonding leads are closer together, and misalignment of the chip can cause the leads in the two row to cross and short together.

Also, if a bonding shelf is positioned much higher than the die, the bonding leads connected to an outer row of pads can sag and short to an inner row or to the shelf itself. This problem can to some extent be overcome by providing insulation between the two rows, but this is a somewhat cumbersome procedure.

The invention provides an improved semiconductor package and method in which a cavity is provided for the chip or die, a bonding shelf extends peripherally of the cavity, and a layer of metallization extends along the under side of the shelf, wraps around the inner peripheral edge of the shelf and extends along the inner margin of the upper surface of the shelf to form a conductive ring to which leads from the chip are bonded. Additional bonding pads are formed on the upper surface of the shelf, and additional leads from the chip are attached to these pads. In one embodiment, locating fingers align the chip precisely within the cavity.

FIGS. 1 and 2 are fragmentary cross-sectional views of semiconductor packages constructed in accordance with techniques of the prior art.

FIG. 3 is a fragmentary cross-sectional view of one embodiment of a package for a semiconductor device incorporating the invention.

FIG. 4 is a fragmentary top plan view of another embodiment of a package for a semiconductor device according to the invention.

FIG. 5 is a fragmentary cross-sectional view taken along line 5—5 in FIG. 4.

As illustrated in FIG. 3, the package includes a first generally planar body or layer of dielectric material 26 with metallization layers 27, 28 on the upper and lower surfaces thereof. This body has a generally rectangular central opening 29 in which a semiconductor die or chip 30 is mounted, with leads 31 extending between the die or chip and bonding pads formed in the metallization layer 27 on the upper side of the body.

A heatsink 32 is bonded to the under side of body 26 in thermal contact with the chip and forms the floor of a cavity within the opening 29. The heatsink is fabricated of a thermally conductive material such as copper, tungsten, molybdenum, a ceramic, a tungsten-copper alloy, or a molybdenum-copper alloy, and it is bonded to body 26 by a suitable adhesive 33 such as epoxy or solder.

A second body or layer of dielectric material 36 is mounted on the first body and has metallization layers 37, 38 on the upper and lower surfaces thereof. Body 36 has a generally rectangular central opening 39 of greater lateral extent than opening 29, and the metallization layer 38 on lower surface of this body wraps around the inner peripheral edge of the body, as indicated by the reference numeral 40, and extends along the inner margin of the upper surface of the body to form a conductive ring 41 to which leads 42 from the die or chip are bonded. Additional bonding pads and conductive traces 43 are formed in the metallization layer 37 outwardly of the conductive ring on the upper surface of body 36, and leads 44 from the die or chip are bonded to these pads and traces. Additional leads 46 from the die or chip are bonded to metallization layer 37 outwardly of pads 43.

A third body or layer of dielectric material 47 is mounted on the second body, with metallization layers 48, 49 on the upper and lower surfaces thereof. Body 47 has a generally rectangular central opening 51 of greater lateral extent than opening 39, and a lid 52 is mounted on the upper side of this body to close the cavity in which the die or chip is mounted. Bodies 26, 36 and 47 are bonded together with layers 53, 54 of an electrically insulative adhesive.

Bodies 26, 36 and the metallization layers 27, 37 on the upper surfaces thereof form bonding shelves or tiers to which the leads from die or chip 30 are attached, and the wraparound metallization 40 and conductive ring 41 provide means for making connections to the metallization layer 38 on the lower side of body 36. In the embodiment illustrated, the supply voltage $V_{CC}$ is applied to layer 38, and connections to this voltage are made through the conductive ring. Other supply voltages and signals can be carried by other metallization layers as illustrated, and connections with these layers are made through bonding pads on the two shelves.

Connections between the different layers in the package are made by vias such as those indicated by reference numerals 56–58.

The metallization which wraps around the opening in the shelf can also wrap around additional layers of metallization, if desired. One or more such layers can be embedded in body 36, as indicated by dashed lines 59, and can be connected to or insulated electrically from the metallization which wraps around the shelf.

The embodiment of FIGS. 4–5 is generally similar to the embodiment of FIG. 3, and like reference numerals designate corresponding elements in the two embodiments. In the embodiment of FIGS. 4–5, however, the central opening 29 in body 26 is formed with a scalloped contour with fingers 61 which serve to locate or position the die, and relieved areas 62 between the fingers. The under sides of the fingers are cut away, as indicated at 63, to receive adhesive 64 which is squeezed out from between the die and the heatsink as the die is pressed into place, and the relieved areas permit cleaning and visual inspection of the adhesive 64 when the die is installed. Body 26 can be formed either as a single layer or body, with the under sides of the fingers being cut away by machining or another suitable process, or as two layers having the desired profiles for the fingers and the relieved areas beneath the fingers. It is also possible to cut the fingers to length after the artwork has been completed, using fiducials or landmarks on the artwork as guides to assure proper alignment of the die.

The locating fingers are particularly helpful in the assembly of packages with staggered bonding pads where precise alignment of the die is important. The fingers hold the die in the proper position during curing of the adhesive which bonds the die to the heatsink and prevents the die from moving laterally as it is pressed toward the heatsink.

The advantages of the invention are readily apparent when the structure of FIG. 3 is compared with the structures of FIGS. 1 and 2. With the wraparound metallization, only two bonding shelves are required instead of the three in the structure of FIG. 1, and by eliminating one of the bonding shelves, the package can be made about 50 per cent thinner. In addition, the wraparound metallization eliminates the need to dedicate the entire metallization layer on a shelf to a single voltage level or ground conductor, and it eliminates the need to preassign pads to power and terminating voltages in advance. The package of FIG. 3 also avoids the need for long bonding leads with high inductance, which are required when vias are employed to make connections with the metallization on the underside of a shelf as in the structure shown in FIG. 2. By eliminating the need for longer leads, the invention avoids the problems sagging and shorting which can occur with the prior art. Finally, the continuous wraparound shelf provides a continuous connection to a power source or termiating voltage and is more tolerant of die misalignment than the packages of the prior art.

It is apparent from the foregoing that a new and improved semiconductor package and method have been provided. While only certain presently preferred embodiments have been described in detail, as will be apparent to those familiar with the art, certain changes and modifications can be made without departing from the scope of the invention as defined by the following claims.

I claim:

1. In a package for a semiconductor chip: a cavity adapted to have a chip mounted therein, a bonding shelf extending peripherally of the cavity and having an inner peripheral edge facing the cavity, and a layer of metallization which extends along the under side of the shelf, wraps around the inner peripheral edge of the shelf and extends continuously along the inner margin of the upper surface of the shelf to form a conductive ring to which leads from the chip are bonded.

2. The package of claim 1 including a plurality of bonding pads on the upper surface of the bonding shelf to which additional leads from the chip are attached.

3. The package of claim 1 including at least one additional layer of metallization within the shelf, with at least a portion of said additional layer being insulated electrically from the metallization which wraps around the inner peripheral edge of the shelf.

4. The package of claim 1 including at least one additional layer of metallization within the shelf, with at least a portion of the additional layer being connected to the metallization which wraps around the inner peripheral edge of the shelf.

5. The package of claim 1 including means for aligning the chip in a predetermined position as it is mounted in the cavity.

6. In a semiconductor package: a chip, a lower bonding shelf surrounding the chip and having an electrically conductive bonding pad on the upper surface thereof, a bonding wire extending between the chip and the bonding pad, an upper bonding shelf positioned above and generally concentric to the lower shelf and having an inner peripheral edge facing the chip, a metallization layer which extends along the under side of the upper shelf, wraps around the inner peripheral edge of the upper shelf and extends continuously along the inner margin of the upper surface of the upper shelf to form a conductive ring, a plurality of bonding pads on the upper shelf, and a plurality of bonding wires interconnecting the chip with the conductive ring and the bonding pads on the upper shelf.

7. The semiconductor package of claim 6 including a heatsink bonded to the under side of the lower bonding shelf in heat transferring relationship with the chip.

8. The package of claim 6 including at least one additional layer of metallization within the upper shelf and insulated electrically from the metallization which wraps around the inner peripheral edge of the shelf.

9. The package of claim 6 including at least one additional layer of metallization within the upper shelf and connected electrically to the metallization which wraps around the inner peripheral edge of the shelf.

10. The package of claim 6 including means for aligning the chip in a predetermined position within the bonding shelves.

11. In a semiconductor package: a first generally planar body of dielectric material having a central opening with electrically conductive metallization on the upper and lower surfaces thereof, a heatsink positioned beneath the first body and extending across the opening to form the floor of a cavity within the opening, a semiconductor chip mounted in the cavity in heat transferring relationship with the heatsink, a bonding wire connecting the chip with the metallization on the upper surface of the first layer, a second generally planar body of dielectric material positioned above the first body and having an inner peripheral edge defining a central opening of greater lateral extent than the opening in the first body, a metallization layer which extends along the under side of the second body, wraps around the inner peripheral edge of the opening in the second body and extends continuously along the inner margin of the upper surface of the second body to form a conductive ring, a plurality of bonding pads on the upper surface of the second body spaced outwardly of the conductive ring, and a plurality of bonding wires interconnecting the chip with the conductive ring and the bonding pads on the upper surface of the second body.

12. The package of claim 11 including at least one additional layer of metallization within the second body of dielectric material and insulated electrically from the metallization which wraps around the inner peripheral edge of the second body.

13. The package of claim 11 including at least one additional layer of metallization within the second body of dielectric material and connected electrically to the metallization which wraps around the inner peripheral edge of the second body.

14. The package of claim 11 wherein the body of dielectric material has a plurality of fingers which extend laterally into the central opening and locate the chip in a predetermined position in the cavity.

15. The package of claim 14 including recessed areas on the under sides of the fingers for accommodating excess adhesive from between the die and the heatsink.

16. In a semiconductor package: a first generally planar body of dielectric material having a central opening with electrically conductive metallization on the upper and lower surfaces thereof, a heatsink positioned beneath the first body and extending across the opening to form the floor of a cavity for receiving a semiconductor chip in heat transferring relationship with the heatsink, a second generally planar body of dielectric material positioned above the first body and having an inner peripheral edge defining a central opening of greater lateral extent than the opening the first body, a metallization layer which extends along the under side of the second body, wraps around the inner peripheral edge of the opening in the second body and extends continuously along the inner margin of the upper surface of the second body to form a conductive ring for connection to the chip, and a plurality of bonding pads on the upper surface of the second body spaced outwardly of the conductive ring for receiving bonding wires connected to the chip.

17. The package of claim 16 including at least one additional layer of metallization within the second body of dielectric material and insulated electrically from the metallization which wraps around the inner peripheral edge of the second body.

18. The package of claim 16 including at least one additional layer of metallization within the second body of dielectric material and connected electrically to the metallization which wraps around the inner peripheral edge of the second body.

19. The package of claim 16 wherein the body of dielectric material has a plurality of fingers which extend laterally into the central opening to locate the chip in a predetermined position in the cavity.

20. The package of claim 19 including recessed areas on the under sides of the fingers for accommodating excess adhesive from between the die and the heatsink.

* * * * *